US006437716B2

(12) United States Patent
Nakao

(10) Patent No.: US 6,437,716 B2
(45) Date of Patent: Aug. 20, 2002

(54) GRAY SCALE DISPLAY REFERENCE VOLTAGE GENERATING CIRCUIT CAPABLE OF CHANGING GAMMA CORRECTION CHARACTERISTIC AND LCD DRIVE UNIT EMPLOYING THE SAME

(75) Inventor: Tomoaki Nakao, Yamatokooriyama (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/731,736

(22) Filed: Dec. 8, 2000

(30) Foreign Application Priority Data

Dec. 10, 1999 (JP) .......................................... 11-351459

(51) Int. Cl.[7] ................................................ H03M 1/06
(52) U.S. Cl. .......................... 341/118; 345/98; 345/209
(58) Field of Search ................................ 341/118, 145, 341/159, 154, 144, 158; 345/89, 98, 100

(56) References Cited

U.S. PATENT DOCUMENTS 5,745,092 A * 4/1998 Ito .............................. 345/95
5,774,106 A * 6/1998 Nitta et al. ................... 345/98
6,157,335 A * 12/2000 Suzuki et al. ............... 341/154
6,166,725 A * 12/2000 Isami et al. ................. 345/209
6,172,661 B1 * 1/2001 Imajo et al. .................. 345/89

* cited by examiner

*Primary Examiner*—Brian Young
*Assistant Examiner*—John Nguyen

(57) ABSTRACT

There is provided a gray scale display reference voltage generating circuit that can change a gamma correction characteristic in accordance with a liquid crystal material and LCD panel characteristics. Resistor elements R0 through R7 have a resistance ratio for gamma correction and generate gamma-corrected intermediate voltages on the basis of voltages across both input terminals V0 and V64. A gamma correction adjustment circuit 42 adjusts the gamma-corrected intermediate voltages upward or downward on the basis of adjustment data latched in a data latch circuit 43. By thus supplying the adjustment data corresponding to the liquid crystal material and the LCD panel characteristics to the data latch circuit 43, the gamma correction characteristic can be changed in accordance with the liquid crystal material and the LCD panel characteristics without modifying the design of a source driver.

10 Claims, 11 Drawing Sheets

GRAY SCALE DISPLAY REFERENCE VOLTAGE GENERATING CIRCUIT CAPABLE OF CHANGING GAMMA CORRECTION CHARACTERISTIC AND LCD DRIVE UNIT EMPLOYING THE SAME

BACKGROUND OF THE INVENTION

The present invention relates to a gray scale display reference voltage generating circuit for use in an LCD (Liquid Crystal Display) drive unit or the like and to an LCD drive unit employing the circuit.

The above-mentioned gray scale display reference voltage generating circuit is a circuit for forming intermediate voltages in between two voltages. For example, in an LCD drive section or the like in an active matrix system LCD device, intermediate voltages are formed by resistance division. Then, resistors for resistance division have a resistance ratio called the gamma (γ) correction, and according to this resistance ratio, the optical characteristics of a liquid crystal material are corrected to provide more natural gray scale display.

Reference will be made below to the construction of an LCD device provided with the aforementioned gray scale display reference voltage generating circuit, the construction of a TFT (Thin Film Transistor) type LCD panel in the LCD device, an LCD drive waveform and a source driver for the LCD panel.

FIG. 6 shows a block diagram of a TFT system LCD device as a representative example of the active matrix system. This LCD device is separated into an LCD section and an LCD drive circuit (LCD drive section) for driving the LCD section. The above-mentioned LCD section has a TFT system LCD panel 1. Then, the LCD panel 1 is internally provided with an LCD element (not shown) and an opposite electrode (common electrode) 2 described in detail later.

On the other hand, the LCD drive circuit includes a source driver assembly 3, a gate driver assembly 4 and a controller 5, which are constructed of ICs (Integrated Circuits) as well as an LCD drive power supply 6. The controller 5 inputs display data D and a control signal S1 to the source driver assembly 3 and inputs a vertical synchronization signal S2 to the gate driver assembly 4. Further, a horizontal synchronization signal is inputted to the source driver assembly 3 and the gate driver assembly 4.

In the above-mentioned construction, the externally inputted display data is inputted as the display data D that is a digital signal to the source driver assembly 3 via the controller 5. Then, the source driver assembly 3 time-sharingly divides the inputted display data D, latches the data into a first source driver through an n-th source driver and thereafter subjects the latched data to D/A (Digital-to-Analog) conversion in synchronization with the horizontal synchronization signal inputted from the controller 5. Then, a gray scale display use analog voltage (referred to as a gray scale display voltage hereinafter) formed by subjecting the time-sharingly divided display data D to D/A conversion is outputted to the corresponding LCD element inside the LCD panel 1 via a source signal line (not shown).

FIG. 7 shows the construction of the LCD panel 1. The LCD panel 1 has pixel electrodes 11, pixel capacitors 12, TFTs 13 for controlling the turning-on and -off of a voltage to be applied to the pixel electrodes 11, source signal lines 14, gate signal lines 15 and an opposite electrode 16 (corresponding to the opposite electrode 2 of FIG. 6). In this case, an LCD element A of one pixel is constructed of the pixel electrode 11, the pixel capacitor 12 and the TFT 13.

The aforementioned gray scale display voltages corresponding to the brightnesses of the pixels to be used for display are applied from the source driver assembly 3 of FIG. 6 to the source signal lines 14. On the other hand, scanning signals for successively turning on the TFTs 13 arranged in the direction of column is applied from the gate driver assembly 4 to the gate signal lines 15. Then, via each TFT 13 in the ON-state, the gray scale display voltages of the source signal lines 14 are applied to the pixel electrodes 11 connected to the drains of the TFTs 13 and elective charges are accumulated in the pixel capacitors 12 provided between the pixel electrode and the opposite electrode 16. Thus, the light transmittance of the liquid crystals is changed in accordance with the gray scale display voltage, executing pixel display.

FIG. 8 and FIG. 9 show an example of an LCD drive waveform. In FIG. 8 and FIG. 9, the reference numerals 21 and 25 denote the drive waveforms of one source driver of the source driver assembly 3, while the reference numerals 22 and 26 denote the drive waveforms of one gate driver of the gate driver assembly 4. The reference numerals 23 and 27 denote the potential of the opposite electrode 16, while the reference numerals 24 and 28 denote the voltage waveforms of the pixel electrode 11. In this case, the voltage applied to the liquid crystal material is a potential difference between the pixel electrode 11 and the opposite electrode 16 and is indicated by the hatching in the figures.

For example, in the case of FIG. 8, the TFT 13 is turned on only when the level of the drive waveform 22 of the gate driver is at H-level, by which a voltage of the difference between the drive waveform 21 of the source driver and the potential 23 of the opposite electrode 16 is applied to the pixel electrode 11. Subsequently, the level of the drive waveform 22 of the gate driver comes to be at L-level, by which the TFT 13 is turned off. In this case, due to the provision of the pixel capacitor 12 for the pixel, the aforementioned voltage is retained.

The same thing can be said for the case of FIG. 9. It is to be noted that FIG. 8 and FIG. 9 respectively show the cases where different voltages are applied to the liquid crystal material. In the case of FIG. 8, the application voltage is higher than that of FIG. 9. As described above, by varying the voltage applied as an analog voltage to the liquid crystal material, the light transmittance of the liquid crystals is varied in an analog manner, providing multilevel gray scale display. It is to be noted that the number of levels of gray that can be provided for display depends on the number of analog voltages to be selectively applied to the liquid crystal material.

FIG. 10 shows a block diagram of an example of the n-th source driver constituting part of the source driver assembly 3 of FIG. 6. The display data D of the inputted digital signal has display data (DR, DG, DB) of R (red), G (green) and B (blue) . Then, the display data D is once latched into an input latch circuit 31 and thereafter time-sharingly stored into a sampling memory 33 in accordance with the operation of a shift register 32 that effects shifting by a start pulse SP and a clock CK supplied from the controller 5. Subsequently, the data are collectively transferred to a hold memory 34 on the basis of the horizontal synchronization signal (not shown) supplied from the controller 5. It is to be noted that the reference letter S denotes a cascade output.

A gray scale display reference voltage generating circuit 39 generates a reference voltage at each level on the basis of a voltage VR supplied from an external reference voltage generating circuit (corresponding to the LCD drive power supply 6 of FIG. 6). The data in the hold memory 34 is transmitted to a D/A converter circuit (Digital-to-Analog converter circuit) 36 via a level shifter circuit 35 and converted into an analog voltage on the basis of the reference voltage at each level from the gray scale display reference voltage generating circuit 39. Then, the analog voltage is outputted as the aforementioned gray scale display voltage from an LCD drive voltage output terminal 38 to the source signal lines 14 of the LCD elements A by an output circuit 37. That is, the number of levels of the reference voltages becomes the number of levels of gray that can be provided for display.

FIG. 11 shows the construction of the gray scale display reference voltage generating circuit 39 generating intermediate voltages for outputting a plurality of reference voltages as described above. It is to be noted that the gray scale display reference voltage generating circuit 39 of FIG. 11 generates 64 levels of reference voltages.

This gray scale display reference voltage generating circuit 39 is constructed of nine gray scale voltage input terminals indicated by V0, V8, V16, V24, V32, V40, V48, V56 and V64, resistor elements R0 through R7 having a resistance ratio for gamma correction and a total of 64 resistors (not shown) that are in groups of eight serially connected across both terminals of the resistor elements R0 through R7. As described above, the resistance ratio called the gamma correction is built into the source driver, providing the LCD drive output voltage for conversion into the gray scale display voltage with a line graph characteristic. Therefore, by correcting the optical characteristics of the liquid crystal material by the aforementioned resistance ratio, there can be provided natural gray scale display conforming to the optical characteristics of the liquid crystal material. An example of the LCD drive output voltage characteristic of the conventional gray scale display reference voltage generating circuit 39 is shown in FIG. 12.

However, the aforementioned conventional gray scale display reference voltage generating circuit has the problems as follows. That is, the optimum gamma correction characteristic (the line graph characteristic of the LCD drive output voltage shown in FIG. 12) varies depending on the type of the liquid crystal material and the number of pixels of the LCD panel and varies every LCD module. Then, the resistance division ratio of the built-in gray scale display reference voltage generating circuit 39 of the source driver is determined during the design phase of the source driver. Therefore, when changing the gamma correction characteristic according to the type of the adopted liquid crystal material and the number of pixels of the LCD panel, there is the problem that the source driver is required to be remade on all such occasions.

There can be considered a method for providing a reference voltage adjusting means for adjusting the plurality of gray scale input voltages supplied from the external reference voltage generating circuit to the gray scale voltage input terminals V0 through V64, and adjusting the intermediate voltages to be supplied to the gray scale voltage. input terminals V0 through V64 by the reference voltage adjusting means. However, the provision of the reference voltage adjusting means increases the number of terminals and the circuit scale, leading to an increase in manufacturing cost.

SUMMARY OF THE INVENTION

Accordingly, the object of the present invention is to provide a gray scale display reference voltage generating circuit capable of changing the gamma correction characteristic according to the liquid crystal material and LCD panel characteristics without increasing the manufacturing cost and an LCD drive unit employing the circuit.

In order to achieve the aforementioned object, according to the first aspect of the present invention, there is provided a gray scale display reference voltage generating circuit for generating reference voltages for gray scale display used in converting display data from a digital form into an analog form, comprising:

a reference voltage producing circuit for producing reference voltages of a plurality of levels; and adjustment circuits for adjusting the reference voltages on the basis of external adjustment data.

According to the above-mentioned construction, each of the plurality of levels of reference voltages produced by the reference voltage producing circuit is adjusted by the adjustment circuits on the basis of the external adjustment data. Therefore, even after the LCD drive unit is once mounted with the gray scale display reference voltage generating circuit, the reference voltages can be simply adjusted in accordance with the liquid crystal material and the LCD panel characteristics by externally supplying the adjustment data without remaking the LCD drive unit.

In one embodiment, each of the adjustment circuits comprises:

an input terminal of the reference voltage; an input terminal of the adjustment data; an output terminal of an adjusted voltage; and an adjusted voltage generating circuit that generates a voltage higher than the reference voltage or a voltage lower than the reference voltage according to the adjustment data and outputs the resulting voltage as the adjusted voltage.

According to the above-mentioned construction, the voltage higher or lower than the reference voltage inputted from the input terminal is generated in accordance with the adjustment data by the adjusted voltage generating circuit and outputted as an adjusted voltage from the output terminal.

Furthermore, in one embodiment, the adjusted voltage generating circuit comprises:

a potential difference generating circuit for generating a potential difference according to the adjustment data; and a sum voltage output circuit for outputting a sum voltage of the reference voltage and the potential difference, the sum voltage from the sum voltage output circuit being outputted as the adjusted voltage.

According to the above-mentioned construction, the potential difference corresponding to the adjustment data is generated by the potential difference generating circuit. Then, the sum voltage of the potential difference and the reference voltage is generated by the sum voltage output circuit and outputted as the adjusted voltage.

Furthermore, in one embodiment, the adjusted voltage generating circuit comprises:

a resistor element that is provided between the input terminal and the output terminal and generates a potential difference corresponding to a value of current flowing through the resistor element;

at least one constant current source; and at least one switch element that is turned on and off on the basis of the adjustment data and interposed between the constant current source and the resistor element, the potential difference being varied by varying the value of current flowing through the resistor element by turning-on and-off control of each switch element on the basis of the adjustment data.

According to the above-mentioned construction, when each switch element interposed between the constant current source and the resistor element is controlled to be turned on and off on the basis of the adjustment data, the value of the current flowing through the resistor element interposed between the input terminal and the output terminal is changed. As a result, the potential difference generated across both terminals of the resistor element is changed to adjust the reference voltage by the quantity of adjustment corresponding to the adjustment data and outputted as the adjusted voltage.

Furthermore, one embodiment comprises a buffer amplifier interposed between the resistor element and the output terminal.

According to the above-mentioned construction, an output impedance is reduced by the buffer amplifier interposed between the resistor element and the output terminal, by which an output current is stably taken out of the output terminal.

Furthermore, in one embodiment, the constant current source generates a current weighted with $2^{(n-1)}$ assuming that n is a positive integer, and the adjustment data is multi-bit digital data of binary digits expressed by two's-complement representation.

According to the above-mentioned construction, by setting the bit number of the adjustment data to n, the adjustment data and the weight of the constant current source can be made to correspond to each other, and a potential difference of a multiple corresponding to the adjustment data is generated across both terminals of the resistor element.

Furthermore, in one embodiment, the constant current source is comprised of at least one first constant current source for flowing a current into the resistor element and at least one second constant current source for flowing a current out of the resistor element, and at least one of the switch elements is capable of flowing a current from the first constant current source into the resistor element and the other of the switch elements is capable of flowing a current out of the resistor element to the second constant current source.

According to the above-mentioned construction, if each switch element is controlled to be turned on and off on the basis of the adjustment data, then the first constant current source for flowing a current through the resistor element and the second constant current source for flowing a current out of the resistor element are set. Thus, the quantity of adjustment and the increase or decrease of the reference voltage are set according to the adjustment data.

Furthermore, in one embodiment, the reference voltage producing circuit produces gamma-corrected reference voltages, and the adjustment circuits are gamma correction adjustment circuits for adjusting the gamma-corrected reference voltages.

According to the above-mentioned construction, the reference voltage that is once gamma-corrected is further adjusted in accordance with the liquid crystal material and the LCD panel characteristics. Therefore, the reference voltage adjusted more correctly to the liquid crystal material and the LCD panel characteristics can be generated.

According to the second aspect of the present invention, there is provided an LCD drive unit comprising the gray scale-display reference voltage generating circuit.

According to the above-mentioned construction, the gray scale display reference voltage generating circuit can adjust each of the plurality of levels of reference voltages produced by the reference voltage producing circuit on the basis of the adjustment data. Therefore, by externally supplying the adjustment data, the reference voltages are simply adjusted in accordance with the liquid crystal material and the LCD panel characteristics without remaking the LCD drive unit.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
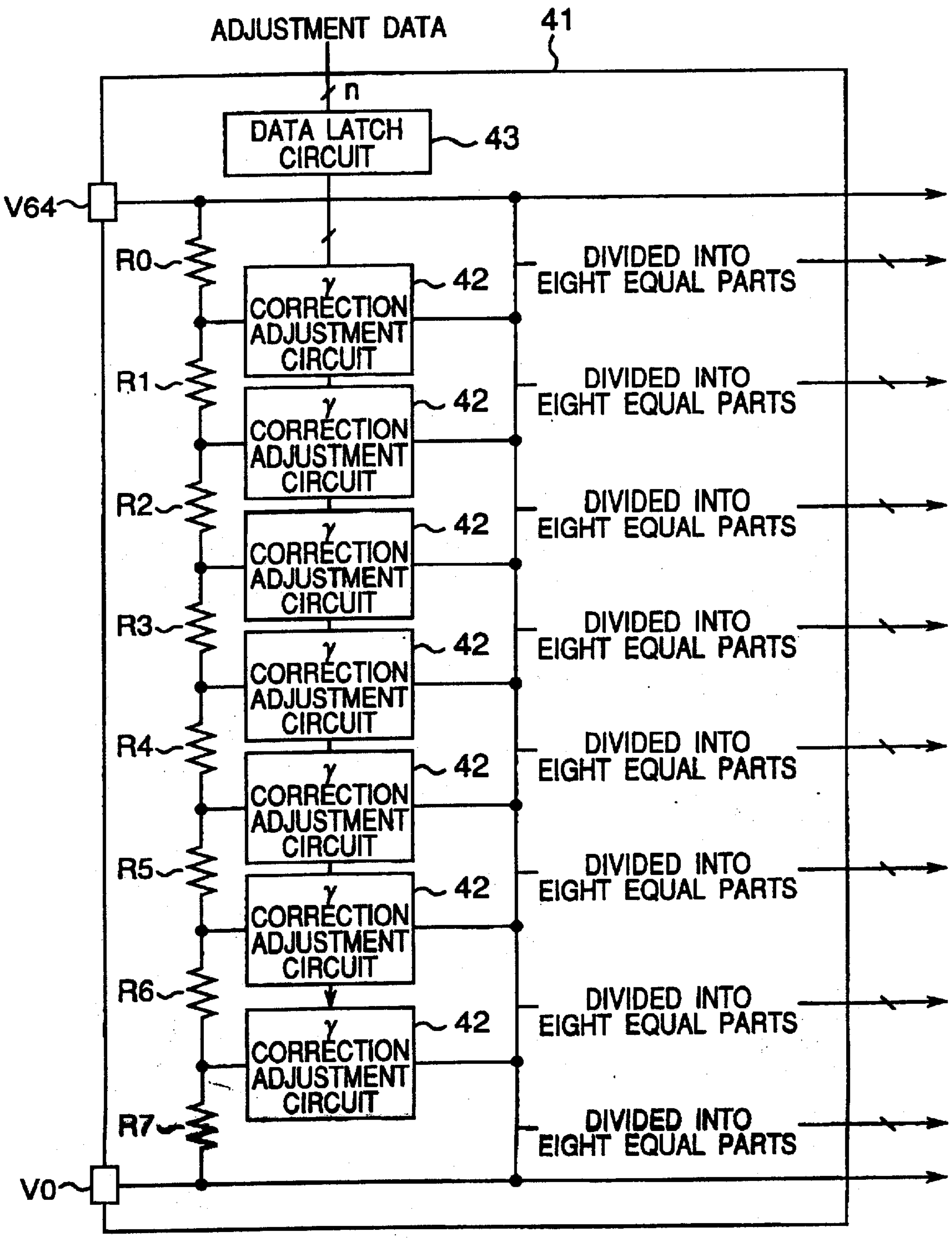
FIG. 1 is a block diagram showing the construction of a gray scale display reference voltage generating circuit of the present invention.

The present invention will be described in detail below on the basis of the embodiments thereof shown in the drawings. FIG. 1 is a block diagram showing the construction of a gray scale display reference voltage generating circuit of the present embodiment. This gray scale display reference voltage generating circuit can be used particularly for an LCD drive circuit in an active matrix system LCD device. It is to be noted that the construction of the LCD device in which the gray scale display reference voltage generating circuit of the present embodiment is built, the construction of the LCD panel of the LCD device, the LCD drive waveform and the construction of the source driver of the LCD panel are identical to the construction of the LCD device, the construction of the LCD panel, the LCD drive waveform and the construction of the source driver described with reference to FIG. 6 through FIG. 10, and therefore, no description is provided for them herein.

Figure 11:
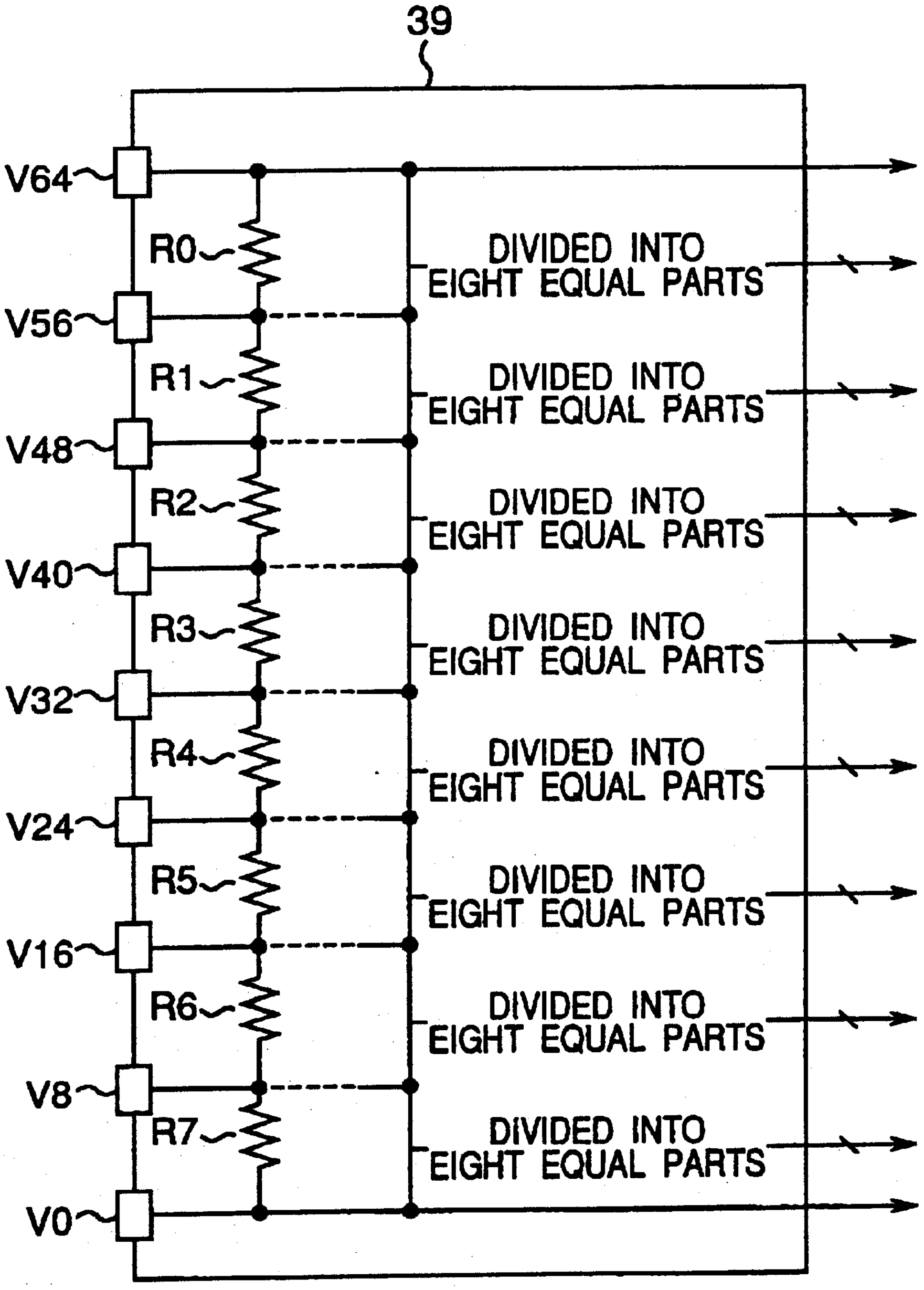
Fig.11 PRIOR ART
FIG. 11 is a diagram showing the construction of a gray scale display reference voltage generating circuit in FIG. 10.
Figure 12:
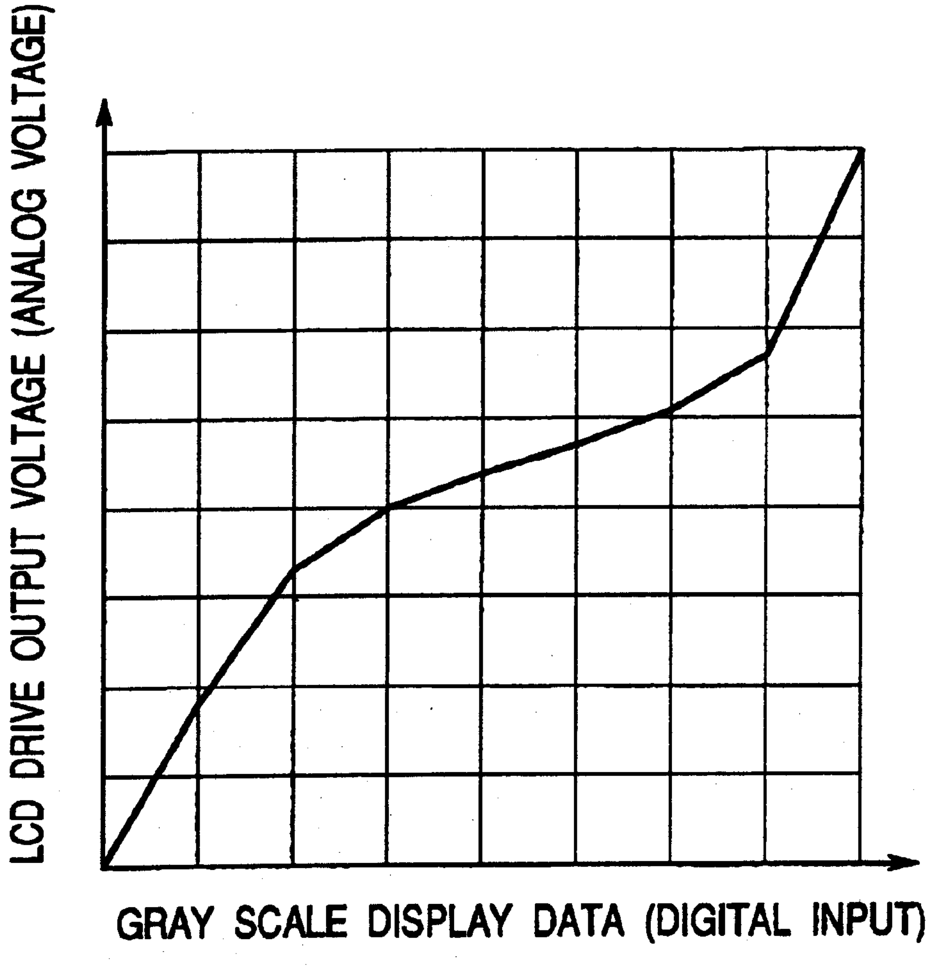
FIG. 12 is a graph showing an example of an LCD drive output voltage characteristic of the gray scale display reference voltage generating circuit shown in FIG. 11.

The gray scale display reference voltage generating circuit 41 of the present embodiment forms 64 levels of reference voltages and generates intermediate voltages similarly to the conventional gray scale display reference voltage generating circuit 39 shown in FIG. 11.

The gray scale display reference voltage generating circuit 41 of the present embodiment includes two voltage input terminals of a highest voltage input terminal V0 and a lowest voltage input terminal V64, eight resistor elements R0 through R7 having resistance ratios that serve as a reference for executing gamma correction, a gamma (γ) correction adjustment circuit 42 for upward or downward fine adjustment of each gamma-corrected reference voltage produced by the resistor elements R0 through R7 within a specified range and a data latch circuit 43 for latching adjustment data to be used by the gamma correction adjustment circuit 42 during the fine adjustment. The resistor elements R0 through. R7 constitute a reference voltage producing circuit. There is further a total of 64 resistors (not shown) that are in groups of eight serially connected across the highest voltage input terminal V0 and the output terminal of the uppermost gamma correction adjustment circuit 42, across the output terminals of the intermediate gamma correction adjustment circuits 42 and across the output terminal of the lowermost gamma correction adjustment circuit 42 and the lowest voltage input terminal V64.

With the above construction, there is no need to provide nine gray scale voltage input terminals V0 through V64, dissimilar to the conventional gray scale display reference voltage generating circuit 39 shown in FIG. 11, and the intermediate voltages can be generated and adjusted in the gray scale display reference voltage generating circuit 41.

Figure 2:
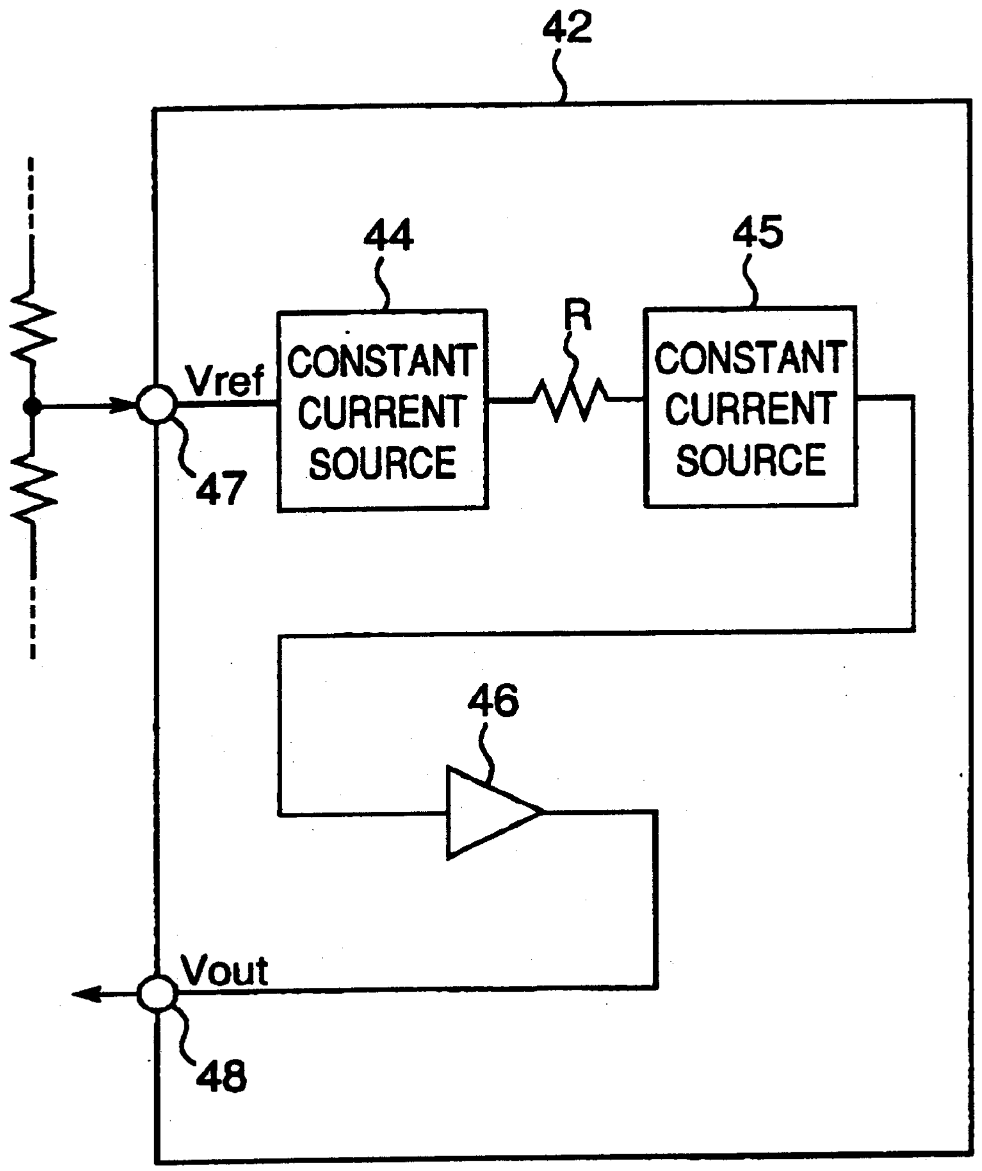
FIG. 2 is a schematic block diagram of a gamma correction adjustment circuit in FIG. 1.

FIG. 2 is a schematic block diagram showing the construction of the gamma correction adjustment circuit 42. The gamma correction adjustment circuit 42 is constructed of one resistor element R for generating a voltage drop, two constant current sources 44 and 45 and a buffer amplifier 46. By taking advantage of the voltage drop caused by the current flowing through the resistor element R, the output voltage is adjusted by shifting the inputted voltage upward or downward by a specified voltage. The gamma correction adjustment circuit 42 having the above construction operates as follows.

That is, for example, a voltage Vref that serves as a reference is supplied to an input terminal 47 of the gamma correction adjustment circuit 42. When obtaining an output voltage higher or lower than the reference voltage Vref, a current i flowing through the resistor element R(R is also used to represent resistance) is varied by the constant current sources 44 and 45, and by taking advantage of the voltage drop caused by the resistor element R, an output voltage Vout obtained by shifting the inputted voltage upward or downward by the voltage drop at the resistor element R is outputted from an output terminal 48.

That is, the voltage is adjusted by the gamma correction adjustment circuit 42 so that the equation:

$$Vout=Vref+i\cdot R$$

holds when obtaining an output voltage Vout higher than the reference voltage Vref or the equation:

$$Vout=Vref-i\cdot R$$

holds when obtaining an output voltage Vout lower than the reference voltage Vref.

Figure 3A:
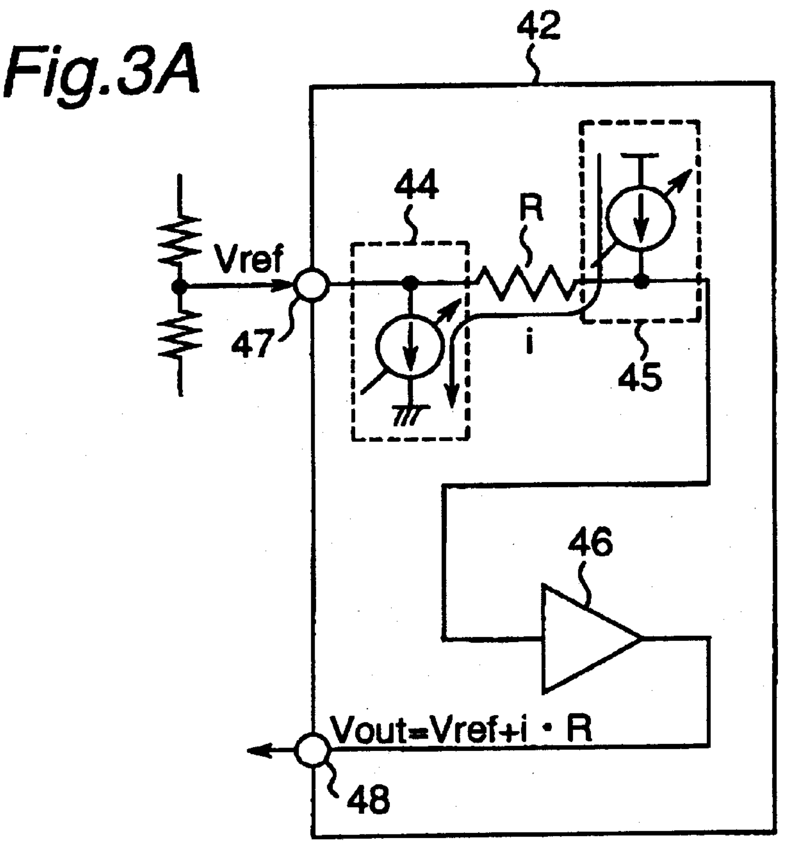
FIGS. 3A and 3B are explanatory views of the operation of a constant current source when obtaining an output voltage higher than a reference voltage and when obtaining an output voltage lower than the reference voltage.
Figure 3B:
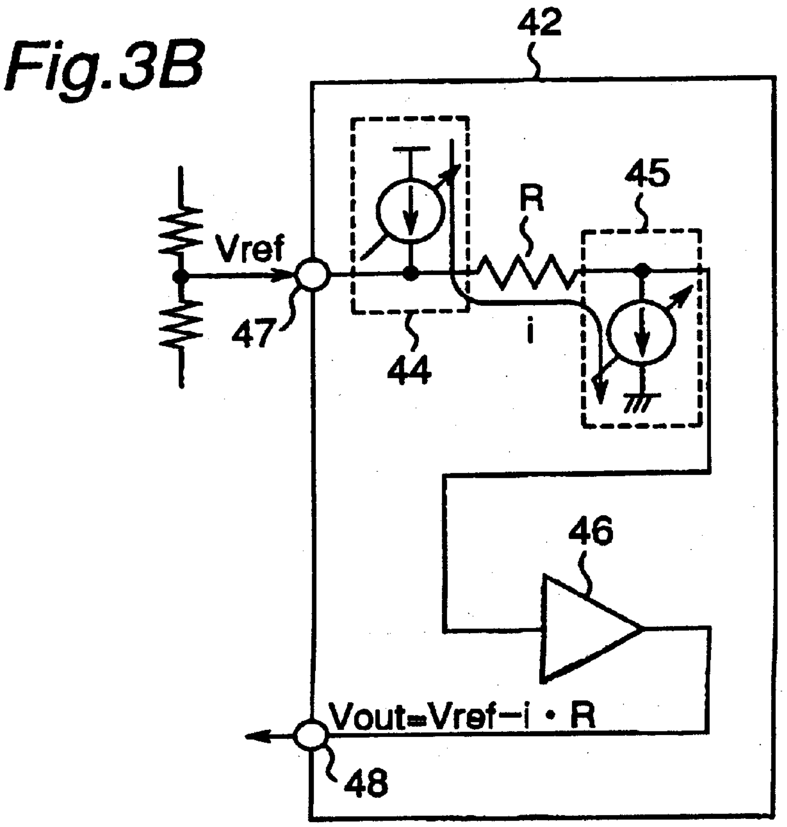

FIGS. 3A and 3B show a state in which the current flowing through the resistor element R is varied by the operations of the constant current sources 44 and 45 when obtaining an output voltage Vout higher than the reference voltage Vref (FIG. 3A) and when obtaining an output voltage Vout lower than the reference voltage Vref (FIG. 3B). In the above case, as shown in FIG. 3A, by grounding the constant current source 44 located on the input terminal 47 side of the resistor element R and connecting the constant current source 45 located on the output terminal 48 side to the power source, a current i directed in the positive direction from the constant current source 45 to the constant current source 44 flows through the resistor element R. Consequently, the output voltage Vout from the output terminal 48 when the reference voltage Vref is inputted from the input terminal 47 comes to have a voltage expressed by the equation:

$$Vout=Vref+i\cdot R$$

which is higher than the reference voltage Vref by the voltage drop at the resistor element R.

In contrast to the above, as shown in FIG. 3B, by connecting the constant current source 44 to the power source and grounding the constant current source 45, a current i directed in the negative direction from the constant current source 44 to the constant current source 45 flows through the resistor element R. Consequently, the output voltage Vout from the output terminal 48 when the reference voltage Vref is inputted from the input terminal 47 comes to have a voltage expressed by the equation:

$$Vout=Vref-i\cdot R$$

which is lower than the reference voltage Vref by the voltage drop at the resistor element R.

Then, by enabling changeover of the current value between a plurality of values with regard to the constant current sources 44 and 45 of individual gamma correction adjustment circuit 42, enabling changeover between the ground and the power source and controlling the above-mentioned changeover operations by the adjustment; data latched in the data latch circuit 43, the gamma-corrected voltages obtained by the resistor elements R0 through R7 are finely adjusted. The thus finely adjusted voltages between the reference voltages are respectively further divided into eight equal parts by eight resistors among the 64 resistors and they are transmitted to a D/A converter circuit (see FIG. 10).

Figure 4:
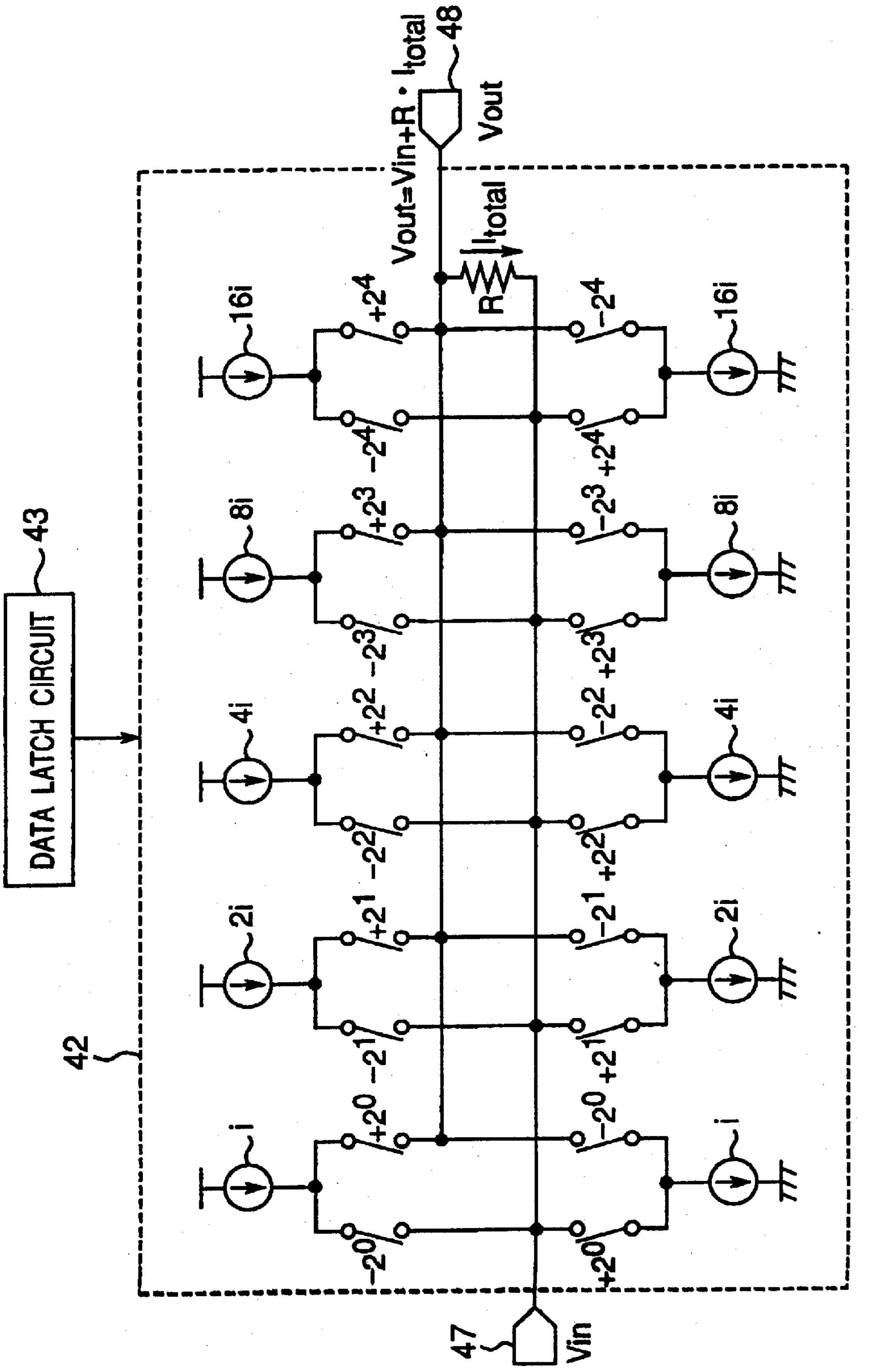
FIG. 4 is a diagram showing the circuit construction of a constant current source section in the gamma correction adjustment circuit.

FIG. 4 shows the circuit construction of a constant current section of the gamma correction adjustment circuit 42 for executing changeover of the current values and changeover of connection between the ground and the power source concerning the constant current sources 44 and 45. As shown in the upper half of FIG. 4, this constant current section is connected to the power source and includes five constant current sources i, 2i, 4i, 8i and 16i for generating a current $2^{(n-1)}$i weighted with $2^{(n-1)}$ assuming that n is a positive integer. Then, each constant current source $2^{(n-1)}$ is connected to one terminal of the resistor element R and an output terminal 48 via a switch $+2^{(n-1)}$ turned on by a control signal $+2^{(n-1)}$. The constant current source $2^{(n-1)}$i is further connected to the other terminal of the resistor element R and the input terminal 47 via a switch $-2^{(n-1)}$ turned on by a control signal $-2^{(n-1)}$.

Likewise, as shown in the lower half of FIG. 4, there are provided five constant current sources i, 2i, 4i, 8i and 16i that are grounded and generate the current $2^{(n-1)}$i weighted with $2^{(n-1)}$. Then, each current source $2^{(n-1)}$i is connected to the other terminal of the resistor element R and the input terminal 47 via a switch $+2^{(n-1)}$ turned on by the control signal $+2^{(n-1)}$. The constant current source $2^{(n-1)}i$ is further connected to the one terminal of the resistor element R and the output terminal 48 via a switch $-2^{(n-1)}$ turned on by the control signal $-2^{(n-1)}$.

That is, the constant current source $2^{(n-1)}i$ connected to the input terminal 47 via the switch $+2^{(n-1)}$ functions as the constant current source 44 of FIG. 3A, and the constant current source $2^{(n-1)}i$ connected to the input terminal 47 via the switch $-2^{(n-1)}$ functions as the constant current source 44 of FIG. 3B, while the constant current source $2^{(n-1)}i$ connected to the output terminal 48 via the switch $+2^{(n-1)}$ functions as the constant current source 45 of FIG. 3A and, the constant current source $2^{(n-1)}$ connected to the output terminal 48 via the switch $-2^{(n-1)}$ functions as the constant current source 45 of FIG. 3B. Then, by controlling the turning-on and -off of the switch $+2^{(n-1)}$ and the switch $-2^{(n-1)}$ on the basis of the adjustment data that is the multi-bit digital data of binary digits coded by the two's-complement latched in the data latch circuit 43, the changeover of the current value and the changeover of connection between the power source and the ground concerning the constant current sources 44 and 45 are achieved.

With the above arrangement, the value and the direction of the current flowing through the resistor element R can be varied, allowing the outputting of the voltage Vout obtained by shifting the input voltage Vin by several steps upward or downward by the voltage drop occurring at the resistor element R. This will be described below giving a concrete example.

The following description is based on the assumption that the adjustment data is 6-bit data. The adjustment based on the adjustment data of the 6-bit representation enables the execution of adjustment of the gamma correction value in 64 steps ranging from −32 to +31.

Referring to FIG. 4, the constant current sources i, 2i, 4i, 8i and 16i generate currents i, 2i, 4i, 6i and 16i weighted with $2^{(n-1)}$. The switch $+2^{(n-1)}$ and the switch $-2^{(n-1)}$ are turned on or off on the basis of the 6-bit adjustment data inputted from the data latch circuit 43. The operation of the gamma correction adjustment circuit 42 based on the 6-bit adjustment data will be described below.

As a first case, reference is made to the case where the adjustment data is "+1:(000001)". In this case, only two switches $+2^0$ are turned on, and all the other switches are turned off. This state is the same as the state of FIG. 3A. That is, a current $I_{total}$ flowing through the resistor element R is equivalent to a constant current i of a constant current source i, and the direction of the current is positive as described hereinabove. Therefore, the output voltage Vout is raised from the inputted reference voltage Vin by the voltage drop occurring at the resistor element R, as a consequence of which an output voltage represented by the equation:

$$Vout=Vin+i\times R$$

is obtained. This is a voltage that is higher than the input reference voltage Vin by (i×R).

As another case, reference is made to the case where the adjustment data is "−9:(100111)". In this case, a total of four switches of two switches $-2^3$ and two switches $-2^0$ are turned on, and all the other switches are turned off. This state is the same as that of FIG. 3B. That is, the current $I_{total}$ flowing through the resistor element R becomes 9i of the sum of the constant current i and the constant current 8i, and the direction of the current is negative as described hereinabove. Therefore, the output voltage Vout is lowered from the inputted reference voltage Vin by the voltage drop occurring at the resistor element R, as a consequence of which an output voltage represented by the equation:

$$Vout=Vin-9i\times R$$

is obtained. This is a voltage that is lower than the input reference voltage Vin by nine times the value of (i×R).

In the case of the other adjustment data, by turning on or off the switches $+2^{(n-1)}$ and $-2^{(n-1)}$ according to the aforementioned operation, the voltage adjustment can be executed in 64 steps ranging from −32 to +31 with the voltage of (i×R) per step centered at the input reference voltage Vin.

That is, by using the multi-bit digital data of binary digits coded by the two's-complement representation as the adjustment data, the bit number n and the weight (magnification) $2^{(n-1)}$ of the value of the current flowing through the resistor element R can be made to correspond to each other via the switches $+2^{(n-1)}$ and $-2^{(n-1)}$. Therefore, a quantity of adjustment of the magnification corresponding to the adjustment data from the data latch circuit 43 can be obtained. That is, the quantity of adjustment of the reference value can be simply designated by the adjustment data.

Figure 5:
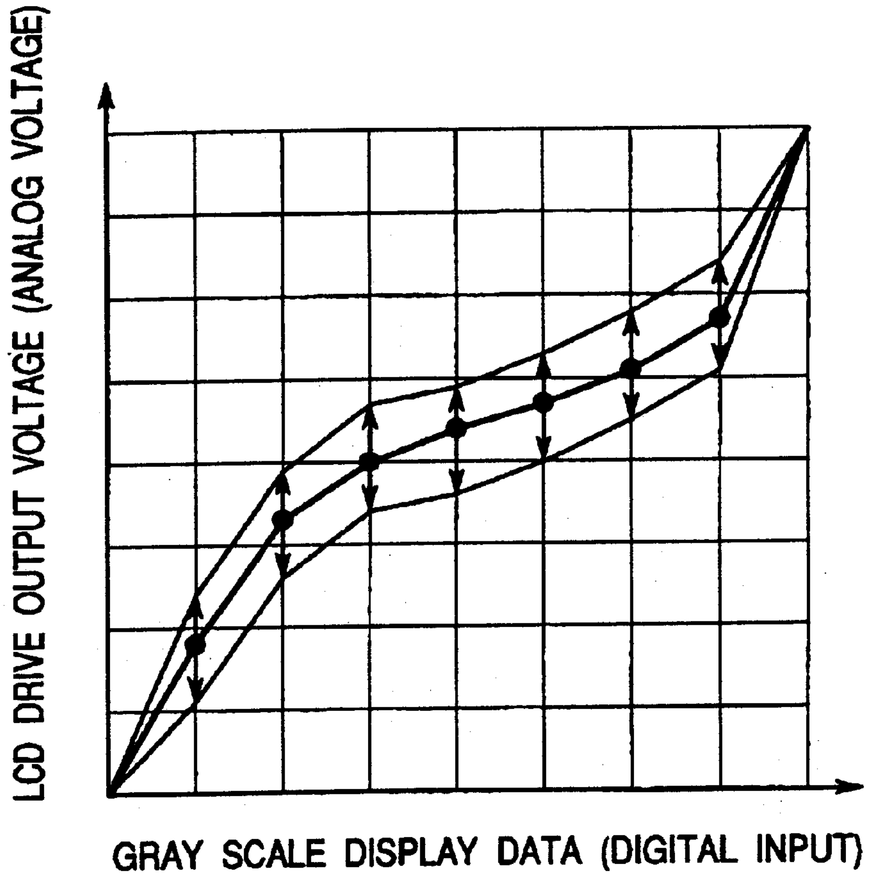
FIG. 5 is a graph showing the characteristics of an LCD drive output voltage of the gray scale display reference voltage generating circuit shown in FIG. 1.
Figure 6:
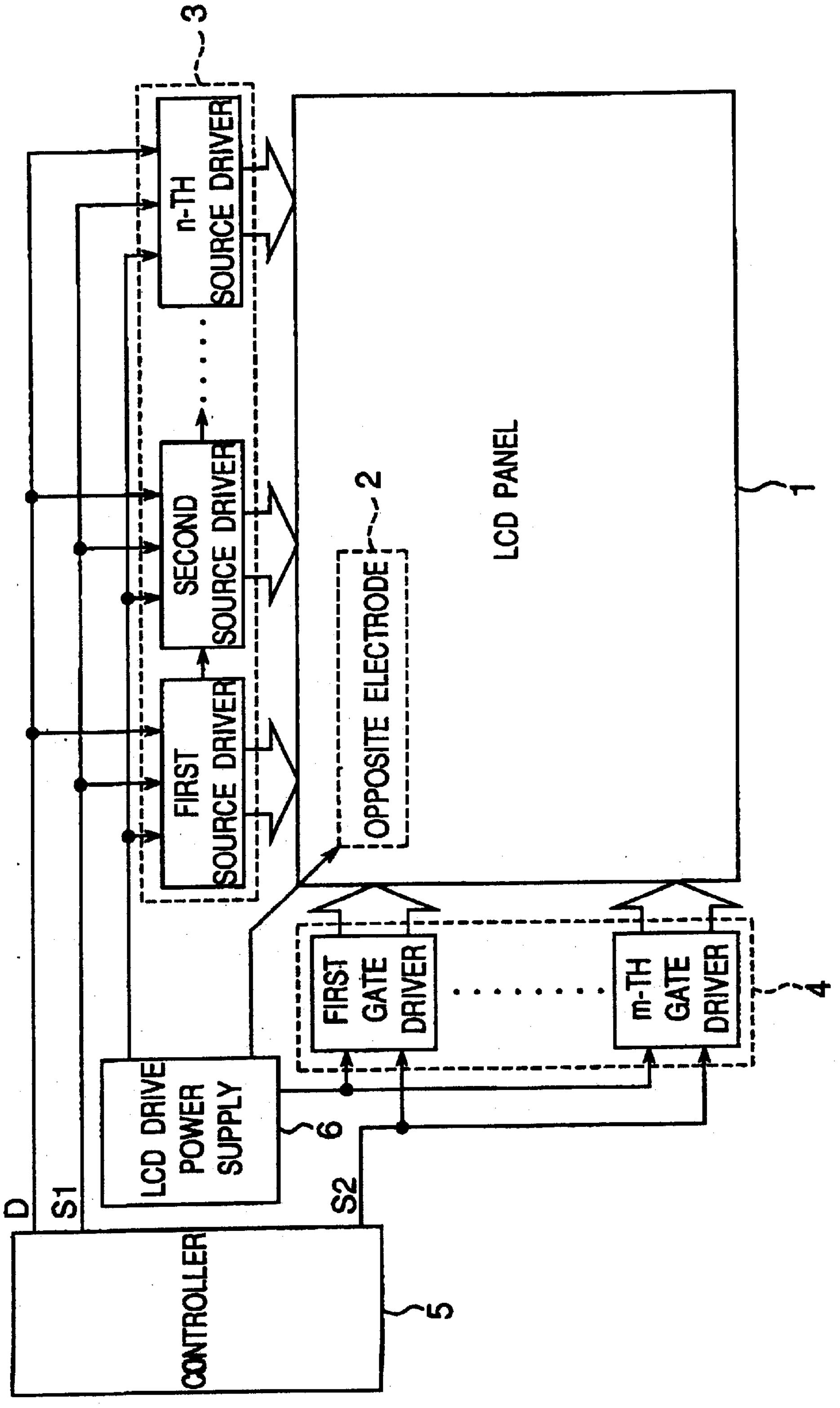
Fig.6 PRIOR ART
FIG. 6 is a block diagram showing a TFT system LCD device.
Figure 7:
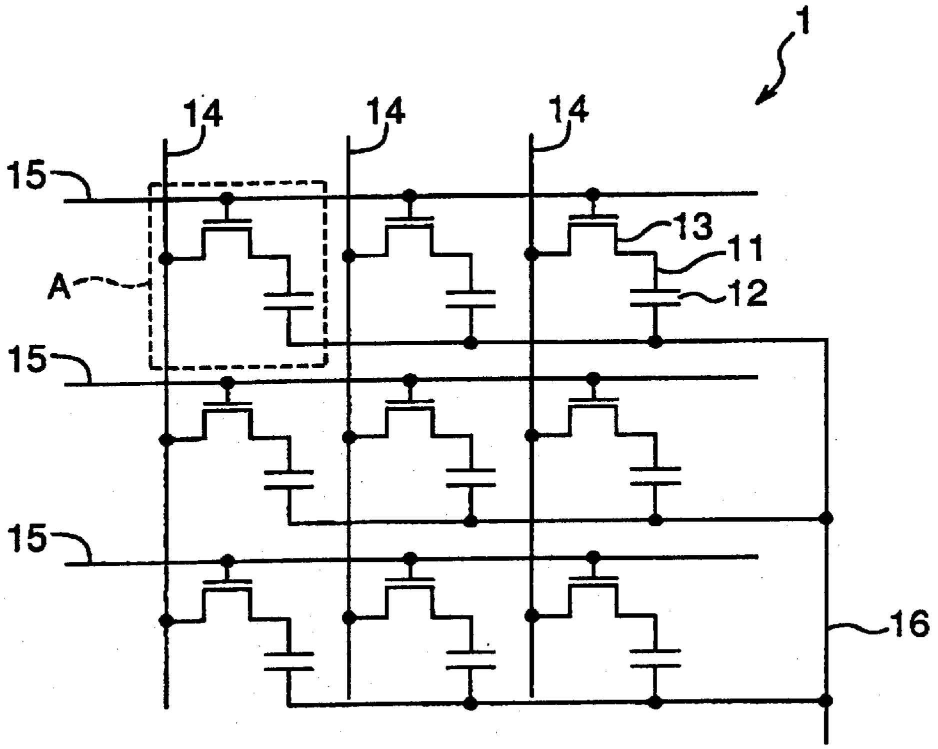
Fig.7 PRIOR ART
FIG. 7 is a diagram showing the construction of an LCD panel in FIG. 6.
Figure 8:
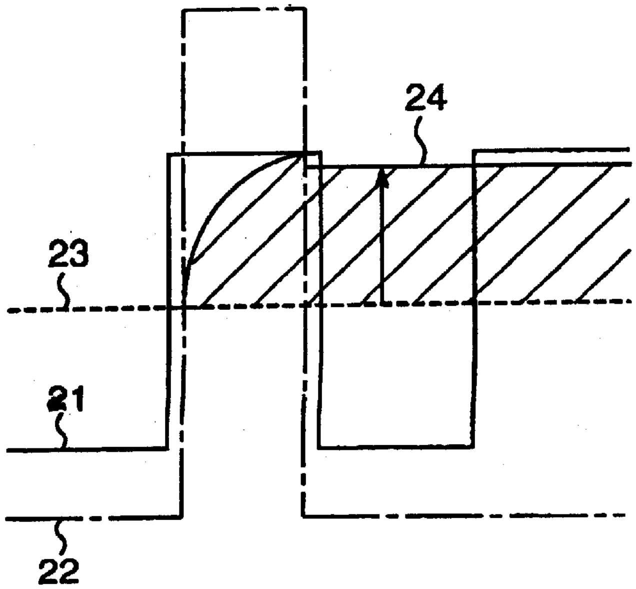
Fig.8 PRIOR ART
FIG. 8 is a chart showing an example of an LCD drive waveform.
Figure 9:
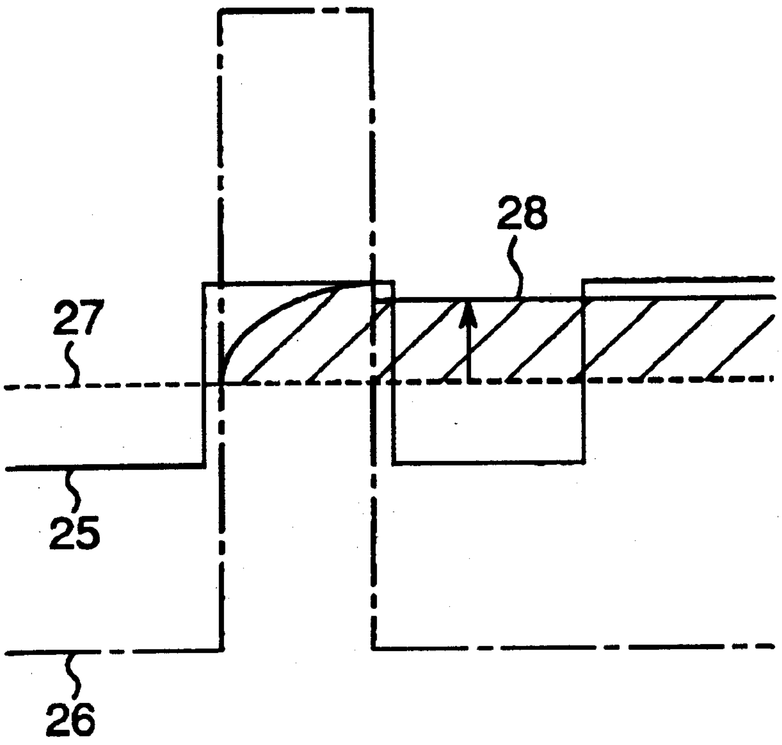
Fig.9 PRIOR ART
FIG. 9 is a chart showing an LCD drive waveform when an application voltage is lower than that of FIG. 8.

By thus turning on and off the switches $+2^{(n-1)}$ and $-2^{(n-1)}$ according to the adjustment data from the data latch circuit 43, the voltage obtained by adjusting the input voltage on the basis of the adjustment data can be outputted. By applying this adjustment to the gamma correction value based on the resistor elements R0 through R7, the characteristics of the LCD drive output voltage can be changed upward or downward on the basis of the adjustment data centered at the correction value based on the resistor elements R0 through R7 as shown in FIG. 5.

Figure 10:
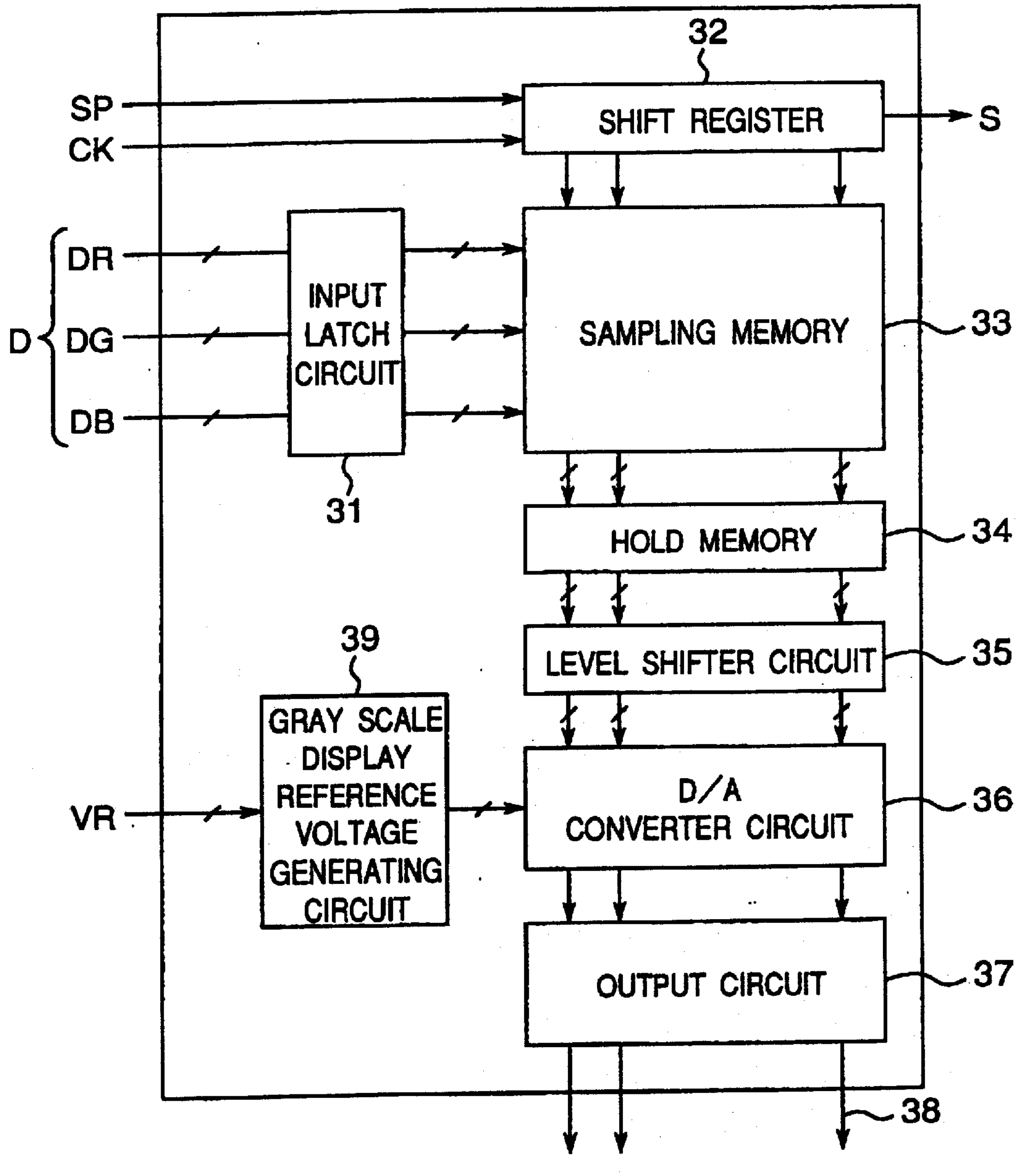
Fig.10 PRIOR ART
FIG. 10 is a block diagram of a source driver in FIG. 6.

It is to be noted that the writing of the adjustment data into the data latch circuit 43 can be executed by using the input terminal of the normal display data D in synchronization with the clock signal for taking in the display data via, for example, an input latch circuit, a sampling memory, a hold memory and a level shifter circuit (see FIG. 10).

As described hereinabove, in the aforementioned embodiment, the gray scale display reference voltage generating circuit 41 for supplying the reference voltages to the D/A converter circuit of the source driver includes the gamma correction adjustment circuit 42 for adjusting upward or downward the reference voltage Vref from the resistor elements R0 through R7 having the resistance ratio for gamma correction on the basis of the adjustment data stored in the data latch circuit 43.

This gamma correction adjustment circuit 42 is constructed as follows. In detail, the five constant current sources $2^{(n-1)}i$ that are connected to the power source and generate the current $2^{(n-1)}i$ weighted with $2^{(n-1)}$ on the assumption that n is a positive integer are connected to the resistor element R and the output terminal 48 via the switch $+2^{(n-1)}$ that is turned on by the control signal of $+2^{(n-1)}$ and connected to the resistor element R and the input terminal 47 via the switch $-2^{(n-1)}$ turned on by the control signal of $-2^{(n-1)}$. Likewise, the five constant current sources $2^{(n-1)}i$ that are grounded and generate the current $2^{(n-1)}i$ weighted with $2^{(n-1)}$ are connected to the resistor element R and the input terminal 47 via the switch $+2^{(n-1)}$ turned on by the control signal of $+2^{(n-1)}$ and connected to the resistor element R and the output terminal 48 via the switch $-2^{(n-1)}$ turned on by the control signal of $-2^{(n-1)}$.

Therefore, by controlling the turning-on and -off of the switches $+2^{(n-1)}$ and $2^{(n-1)}$ on the basis of the 6-bit adjustment data from the data latch circuit 43, the combination of the value and direction of current flowing through the resistor element R can be switched and set in 64 ways That is, each reference voltage Vref that has undergone gamma correction of the resistor elements R0 through R7 can be adjusted totally in 64 steps including 31 upward steps and 32 downward steps.

That is, according to this embodiment, by, for example, adding the adjustment data to the display data and writing the adjustment data into the data latch circuit 43 by utilizing the input terminal of the display data D, the gamma correction characteristic can be simply changed. This accordingly obviates the need for changing the design of the source driver in accordance with the liquid crystal material and the LCD panel characteristics, allowing the provision of a source driver capable of coping with the change without remaking the LSI's (large scale integrated circuits) on all such occasions.

In the above case, the gray scale display reference voltage generating circuit 41 generates the desired intermediate voltages by the resistor elements R0 through R7 and the gamma correction adjustment circuit 42, and therefore, it is not required to externally supply, for example, nine levels of gray scale reference voltages. Therefore, the external circuit scale and the number of terminals can be reduced by providing only the two input terminals of the highest voltage input terminal V0 and the lowest voltage input terminal V64 for externally receiving the gray scale reference voltage. Thus, the external circuit scale and the number of terminals can be reduced, allowing the manufacturing cost to be reduced.

As described above, the adjustment data can be any time written into the data latch circuit 43 provided inside the source driver. Therefore, the mass production variations of the gray scale display generated every LCD module can be corrected. Furthermore, the adjustment data can also be written every horizontal line of the LCD panel. Therefore, display of a higher quality can also be achieved by correcting the horizontal shadowing, or one display defect of the LCD panel.

The aforementioned embodiment is provided with live first constant current sources $2^{(n-1)}$i connected to the power source, five switches $+2^{(n-1)}$ for connecting the first constant current sources to the resistor element R and the output terminal 48, five switches $-2^{(n-1)}$ for connecting the first constant current sources to the resistor element R and the input terminal 47, five grounded second constant current sources $2^{(n-1)}$i, five switches $+2^{(n-1)}$ for connecting the second constant current sources to the resistor element R and the input terminal 47 and five switches $-2^{(n-1)}$ for connecting the second constant current sources to the resistor element R and the output terminal 48. The switches $+2^{(n-1)}$ and $-2^{(n-1)}$ are controlled to be turned on and off on the basis of the 6-bit adjustment data, adjusting each gamma-corrected reference voltage Vref in 64 steps. However, the numbers of the constant current sources and the switches and the number of bits of the adjustment data are, of course, not limited to the aforementioned values.

Furthermore, the weighting of the value of the current generated by the constant current source is not limited to "$2^{(n-1)}$" but allowed to be appropriately set taking the liquid crystal material, the LCD panel characteristics and the mass production variations of gray scale display into consideration.

As is apparent from the above, the gray scale display reference voltage generating circuit of the present invention can adjust the plurality of levels of reference voltages produced by the reference voltage producing circuits by the adjustment circuits on the basis of the external adjustment data. Therefore, even after the LCD drive unit is once mounted with the gray scale display reference voltage generating circuit, the reference voltages can be simply adjusted in accordance with the liquid crystal material and the LCD panel characteristics by externally supplying the adjustment data without remaking the LCD drive unit.

Furthermore, by giving the adjustment data at all times, the mass production variations of the gray scale display generated every LCD module mounted with the gray scale display reference voltage generating circuits can be corrected. Furthermore, the desired intermediate voltages are internally produced by the reference voltage producing circuit and the adjustment circuits, and therefore, it is not required to externally supply three or more levels of gray scale reference voltages. Therefore, the external circuit scale and the number of terminals can be reduced, allowing the manufacturing cost to be reduced.

According to the gray scale display reference voltage generating circuit of one embodiment, the adjustment circuit includes the input terminal of the reference voltage, the input terminal of the adjustment data, the output terminal of the adjusted voltage and the adjusted voltage generating circuit that generates the voltage higher or lower than the reference voltage according to the adjustment data and outputs the resulting voltage as the adjusted voltage. With this arrangement, the adjusted voltage according to the adjustment data can be easily generated on the basis of the reference voltage and outputted from the output terminal.

According to the gray scale display reference voltage generating circuit of one embodiment, the adjusted voltage generating circuit is constructed of the potential difference generating circuit for generating the potential difference according to the adjustment data and the sum voltage output circuit for outputting the sum voltage of the reference voltage and the potential difference. With this arrangement, the adjusted voltage generating circuit can be simply formed.

According to the gray scale display reference voltage generating circuit of one embodiment, the adjusted voltage generating circuit is constructed of the resistor element provided between the input terminal and the output terminal, the constant current source and the switch element that is interposed between the constant current source and the resistor element and is turned on and off on the basis of the adjustment data. With this arrangement, the value of current flowing through the resistor element can be varied by controlling the turning-on and -off of each switch element on the basis of the adjustment data, allowing the potential difference across both terminals to be controlled. Therefore, the reference voltage can be adjusted by the quantity of adjustment according to the adjustment data.

The gray scale display reference voltage generating circuit of one embodiment includes the buffer amplifier interposed between the resistor element and the output terminal. With this arrangement, the output current can be stably taken out of the output terminal with reduced output impedance.

According to the gray scale display reference voltage generating circuit of one embodiment, the constant current source generates the current weighted with $2^{(n-1)}$ assuming that n is a positive integer, and the adjustment data is the multi-bit digital data of binary digits expressed by two's-complement form. With this arrangement, the adjustment data and the weight of the constant current source can be made to correspond to each other with the bit number of the adjustment data set to n. Therefore, a potential difference of the multiple corresponding to the adjustment data can be generated across the resistor element.

That is, according to this embodiment, the quantity of adjustment of the reference voltage can be simply designated by the adjustment data. Furthermore, by adding the adjustment data to the display data, display of a higher quality can be obtained by adjusting the reference voltage for gray scale display every horizontal line of the LCD panel and correcting the horizontal shadowing, or one display defect of the LCD panel.

According to the gray scale display reference voltage generating circuit of one embodiment, the constant current source is constructed of the first constant current source for flowing a current into the resistor element and the second constant current source for flowing a current out of the resistor element, and the first constant current source for flowing a current into the resistor element and the second constant current source for flowing a current out of the resistor element are functioned by the switch element. With this arrangement, the quantity of adjustment and the increase or decrease of the reference voltage can be set according to the adjustment data.

According to the gray scale display reference voltage generating circuit of one embodiment, the reference voltage producing circuit produces the gamma-corrected reference voltage; and the adjustment circuit is a gamma correction adjustment circuit for adjusting the gamma-corrected reference voltage. Therefore, the once gamma-corrected reference voltage can be further adjusted in accordance with the liquid crystal material and the LCD panel characteristics. This allows the generation of a reference voltage more correctly adjusted in accordance with the liquid crystal material and the LCD panel characteristics.

The LCD drive unit according to the second aspect of the present invention comprises the gray scale display reference voltage generating circuit capable of adjusting the plurality of levels of produced reference voltages on the basis of the adjustment data. With this arrangement, by externally supplying the adjustment data, the reference voltages can be simply adjusted in accordance with the liquid crystal material and the LCD panel characteristics without remaking the LCD drive unit.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A gray scale display reference voltage generating circuit for generating reference voltages for gray scale display used in converting display data from a digital form into an analog form, comprising:

a reference voltage producing circuit for producing reference voltages of a plurality of levels; and adjustment circuits for adjusting the reference voltages on the basis of external adjustment data.

2. A gray scale display reference voltage generating circuit as claimed in claim 1, wherein each of the adjustment circuits comprises:

an input terminal of the reference voltage; an input terminal of the adjustment data; an output terminal of an adjusted voltage; and an adjusted voltage generating circuit that generates a voltage higher than the reference voltage or a voltage lower than the reference voltage according to the adjustment data and outputs the resulting voltage as the adjusted voltage.

3. A gray scale display reference voltage generating circuit as claimed in claim 2, wherein the adjusted voltage generating circuit comprises:

a potential difference generating circuit for generating a potential difference according to the adjustment data; and a sum voltage output circuit for outputting a sum voltage of the reference voltage and the potential difference, the sum voltage from the sum voltage output circuit being outputted as the adjusted voltage.

4. A gray scale display reference voltage generating circuit as claimed in claim 2, wherein the adjusted voltage generating circuit comprises:

a resistor element that is provided between the input terminal and the output terminal and generates a potential difference corresponding to a value of current flowing through the resistor element;

at least one constant current source; and at least one switch element that is turned on and off on the basis of the adjustment data and interposed between the constant current source and the resistor element, the potential difference being varied by varying the value of current flowing through the resistor element by turning-on and -off control of each switch element on the basis of the adjustment data.

5. A gray scale display reference voltage generating circuit as claimed in claim 4, comprising:

a buffer amplifier interposed between the resistor element and the output terminal.

6. A gray scale display reference voltage generating circuit as claimed in claim 4, wherein the constant current source generates a current weighted with $2^{(n-1)}$ assuming that n is a positive integer, and the adjustment data is multi-bit digital data of binary digits expressed by two's-complement representation.

7. A gray scale display reference voltage generating circuit as claimed in claim 4, wherein the constant current source is comprised of at least one first constant current source for flowing a current into the resistor element and at least one second constant current source for flowing a current out of the resistor element, and at least one of the switch elements is capable of flowing a current from the first constant current source into the resistor element and the other of the switch elements is capable of flowing a current out of the resistor element to the second constant current source.

8. A gray scale display reference voltage generating circuit as claimed in claim 1, wherein the reference voltage producing circuit produces gamma-corrected reference voltages, and the adjustment circuits are gamma correction adjustment circuits for adjusting the gamma-corrected reference voltages.

9. An LCD drive unit comprising the gray scale display reference voltage generating circuit claimed in claim 1.

10. A gray scale display reference voltage generating circuit for generating reference voltages for gray scale display used in converting display data from a digital form into an analog form, comprising:

a reference voltage producing circuit for producing reference voltages of a plurality of levels, the reference voltage producing circuit serially connected across two-level input terminals; and adjustment circuits for adjusting the reference voltages on the basis of external adjustment data.

* * * * *